(12) United States Patent
Kobayashi

(10) Patent No.: US 7,533,955 B2
(45) Date of Patent: May 19, 2009

(54) RECORDING APPARATUS HAVING RADIATOR JOINED TO COMMON VOLTAGE WIRE

(75) Inventor: Isao Kobayashi, Nagoya (JP)

(73) Assignee: Brother Kogyo Kabushiki Kaisha, Nagoya-Shi (JP)

( * ) Notice: Subject to any disclaimer, the term of this patent is extended or adjusted under 35 U.S.C. 154(b) by 13 days.

(21) Appl. No.: 11/903,979

(22) Filed: Sep. 25, 2007

(65) Prior Publication Data
US 2008/0074795 A1    Mar. 27, 2008

(51) Int. Cl.
*B41J 29/377* (2006.01)
(52) U.S. Cl. .................................................. 347/18
(58) Field of Classification Search ............... 347/18, 347/14, 43, 47, 50, 57–59; 400/124.14, 124.15, 400/124.18, 124.23
See application file for complete search history.

(56) References Cited

U.S. PATENT DOCUMENTS

| 6,604,817 | B2 |  | 8/2003 | Isono et al. |
| 6,733,103 | B2 | * | 5/2004 | Murata ........................ 347/14 |
| 2004/0263554 | A1 | * | 12/2004 | Kubo ........................ 347/18 |
| 2005/0253488 | A1 |  | 11/2005 | Ito |
| 2006/0028519 | A1 |  | 2/2006 | Nakamura et al. |

FOREIGN PATENT DOCUMENTS

| JP | 2001-246744 | 9/2001 |
| JP | 2005-262815 | 9/2005 |
| JP | 2005-322850 | 11/2005 |
| JP | 2005313428 | 11/2005 |

* cited by examiner

*Primary Examiner*—Kristal Feggins
(74) *Attorney, Agent, or Firm*—Reed Smith LLP

(57) ABSTRACT

A recording apparatus, including: a recording head including an actuator; a head holder holding the head; a circuit board disposed on the holder and configured to be connected to an external signal source; a drive circuit operable to drive the actuator; a flexible wiring member which includes wires that connect the actuator and the circuit board, which is elongated in a direction in which the wires extend, which is connected to the actuator and the circuit board at longitudinally opposite ends thereof, respectively, and on which the drive circuit is mounted between the longitudinal opposite ends, the wires including (a) a common voltage wire which connects common-voltage portions of the drive circuit and the circuit board and (b) a drive signal wire for driving the actuator; and a radiator having heat conductivity and electric conductivity and disposed between the head and the circuit board so as to extend along the wiring member, the radiator being heat-conductively and electrically joined to: (a) the common voltage wire in the vicinity of the drive circuit; (b) at least one portion of the common voltage wire intermediate between the drive circuit and the circuit board; and (c) at least one of (c-1) the common voltage wire in the vicinity of the circuit board and (c-2) the common-voltage portion of the circuit board connected to the common voltage wire of the wiring member.

8 Claims, 8 Drawing Sheets

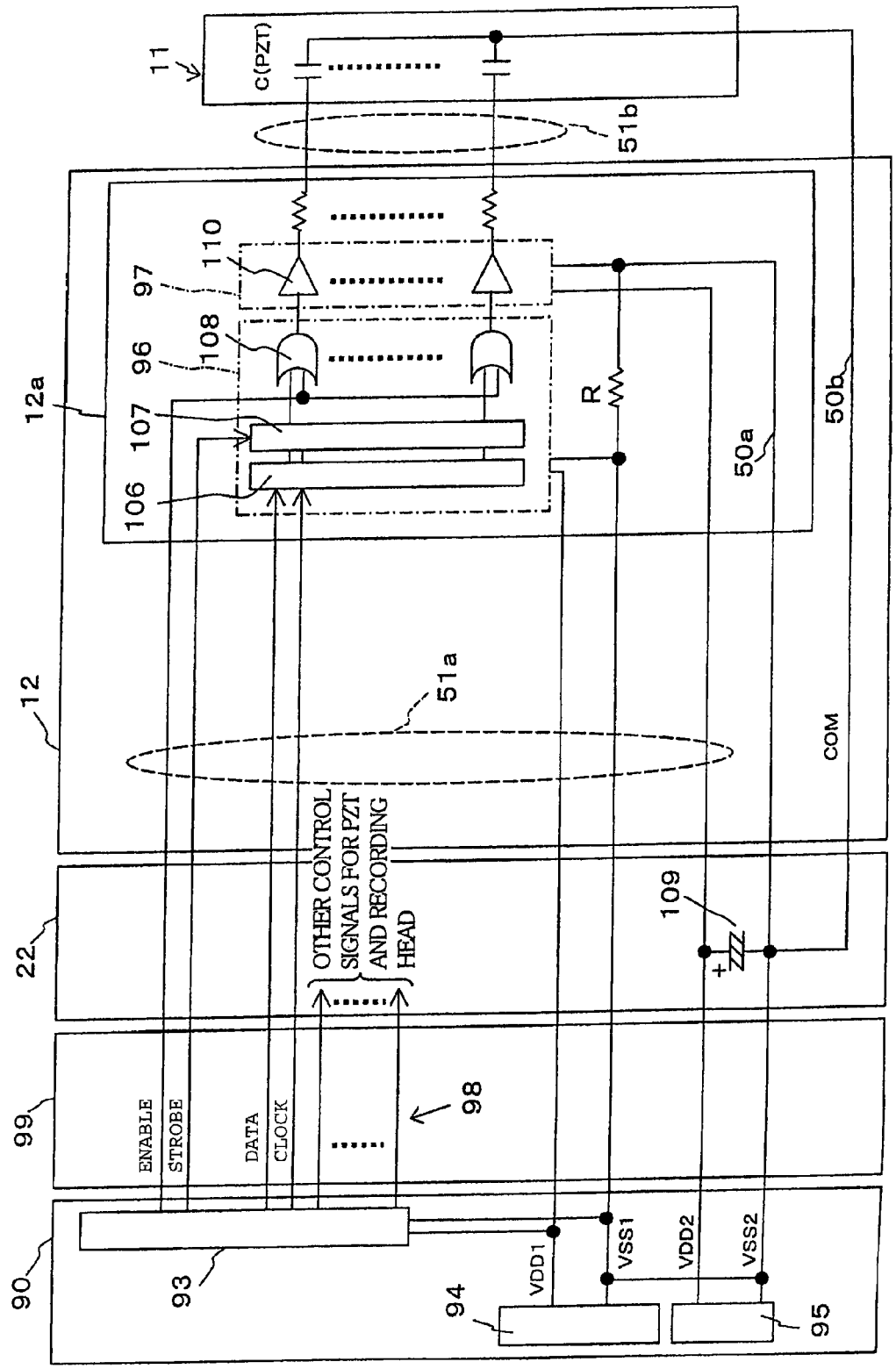

RECORDING APPARATUS HAVING RADIATOR JOINED TO COMMON VOLTAGE WIRE

CROSS REFERENCE TO RELATED APPLICATION

The present application claims priority from Japanese Patent Application No. 2006-260545, which was filed on Sep. 26, 2006, the disclosure of which is herein incorporated by reference in its entirety.

BACKGROUND OF THE INVENTION

1. Field of the Invention

The present invention relates in general to a recording apparatus, and more particularly to a recording apparatus configured such that external signals are inputted to a recording head using a flexible wiring member.

2. Discussion of Related Art

As a recording apparatus configured to perform recording by ejection of ink from a recording head onto a recording medium, there has been conventionally known a recording head as disclosed in a Patent Document 1 (JP-A-2005-262815, in particular, FIGS. 2 and 7, corresponding to US Patent Application Publication No. 2006/0028519A1). In the disclosed recording apparatus, a control device disposed at a stationary portion on a main-body side of the apparatus and a head-side circuit board mounted on a carriage are connected to each other by a flexible wiring member, and the head-side circuit board and the recording head are connected to each other by another flexible wiring member on which is mounted a drive circuit, i.e., an IC chip, for driving the recording head. In the thus constructed recording apparatus, signals from the control device disposed on the main-body side are inputted to the drive circuit via the head-side circuit board, so that the ink is ejected selectively from nozzles of the recording head by an operation of the drive circuit, thereby performing the recording.

However, when the signals are outputted from the drive circuit to the recording head, a large current momentarily flows in the drive circuit, whereby heat is generated in the drive circuit and the temperature in the drive circuit is accordingly increased. Such a temperature increase undesirably causes the electrical characteristic of the drive circuit to be deteriorated and unstable. Further, where the heat is transmitted to the recording head, the temperature of the ink is increased, thus impeding stable ejection of the ink.

In the light of the above-described situation, the recording apparatus disclosed in the above-indicated Patent Document 1 is configured such that a radiator in the form of a plate-like member formed of a metal such as aluminum is disposed on the carriage so as to be in contact with the drive circuit mounted on the flexible wiring member, thereby permitting the heat generated in the drive circuit to be radiated or emitted through the radiator.

SUMMARY OF THE INVENTION

In recent years, the number of nozzles formed in the recording head tends to increase to satisfy a demand for higher resolution and a higher speed of the recording. In accordance with the increase in the number of nozzles (or channels), there is a need to increase conductor wires arranged on the flexible wiring member. However, because a wire on a common voltage side, e.g., on a grounded side, (i.e., a common voltage wire) is common to a plurality of nozzles, a large current flows in the common voltage wire when the plurality of channels are simultaneously driven, resulting in an unstable operation of the recording head.

Further, to deal with an increase in the amount of heat generated in the drive circuit due to the increase in the number of nozzles, the radiator needs to be large-sized.

The present invention has been developed in the light of the situations described above. It is therefore an object of the invention to provide a recording apparatus in which an electric capacity of the common voltage wire is increased while the heat generated in the drive circuit can be efficiently dissipated, thereby enabling the drive circuit and the recording head to be stably operated.

To achieve the object indicated above, the present invention provides a recording apparatus, comprising: a recording head including an actuator and operable to perform recording by an operation of the actuator; a head holder holding the recording head; a circuit board disposed on the head holder and configured to be connected to an external signal source; a drive circuit operable to drive the actuator; a flexible wiring member which includes a plurality of conductor wires that connect the actuator and the circuit board, which is elongated in a direction in which the plurality of conductor wires extend, which is connected to the actuator and the circuit board at longitudinally opposite ends thereof, respectively, and on which the drive circuit is mounted between the longitudinal opposite ends, the plurality of conductor wires including a common voltage wire which connects a common-voltage portion of the drive circuit and a common-voltage portion of the circuit board and a drive signal wire for driving the actuator; and a radiator having heat conductivity and electric conductivity and disposed between the recording head and the circuit board so as to extend along the flexible wiring member, the radiator being heat-conductively and electrically joined to: (a) the common voltage wire in the vicinity of the drive circuit; (b) at least one portion of the common voltage wire intermediate between the drive circuit and the circuit board; and (c) at least one of (c-1) the common voltage wire in the vicinity of the circuit board and (c-2) the common-voltage portion of the circuit board which is connected to the common voltage wire of the flexible wiring member.

In the recording apparatus constructed as described above, the radiator has the same voltage as the common voltage wire between the vicinity of the drive circuit and the circuit board. Accordingly, the arrangement realizes a state in which the number of the common voltage wire is substantially increased or a state in which a cross sectional area of the common voltage wire is substantially enlarged. In consequence, the common voltage wire has an increased heat capacity and a reduced impedance, allowing the recording head to be driven and operated with high stability.

In the recording apparatus constructed as described above, the radiator is disposed between the recording head and the circuit board so as to extend in a longitudinal direction of the flexible wiring member, so that the heat generated in the drive circuit can be transmitted to and dissipated from the radiator.

BRIEF DESCRIPTION OF THE DRAWINGS

The above and other objects, features, advantages and technical and industrial significance of the present invention will be better understood by reading a following detailed description of preferred embodiments of the invention, when considered in connection with the accompanying drawings, in which:

FIG. 8 is a diagram showing one example of an electric circuit of the ink-jet recording apparatus.

DETAILED DESCRIPTION OF THE PREFERRED EMBODIMENTS

Figure 1:
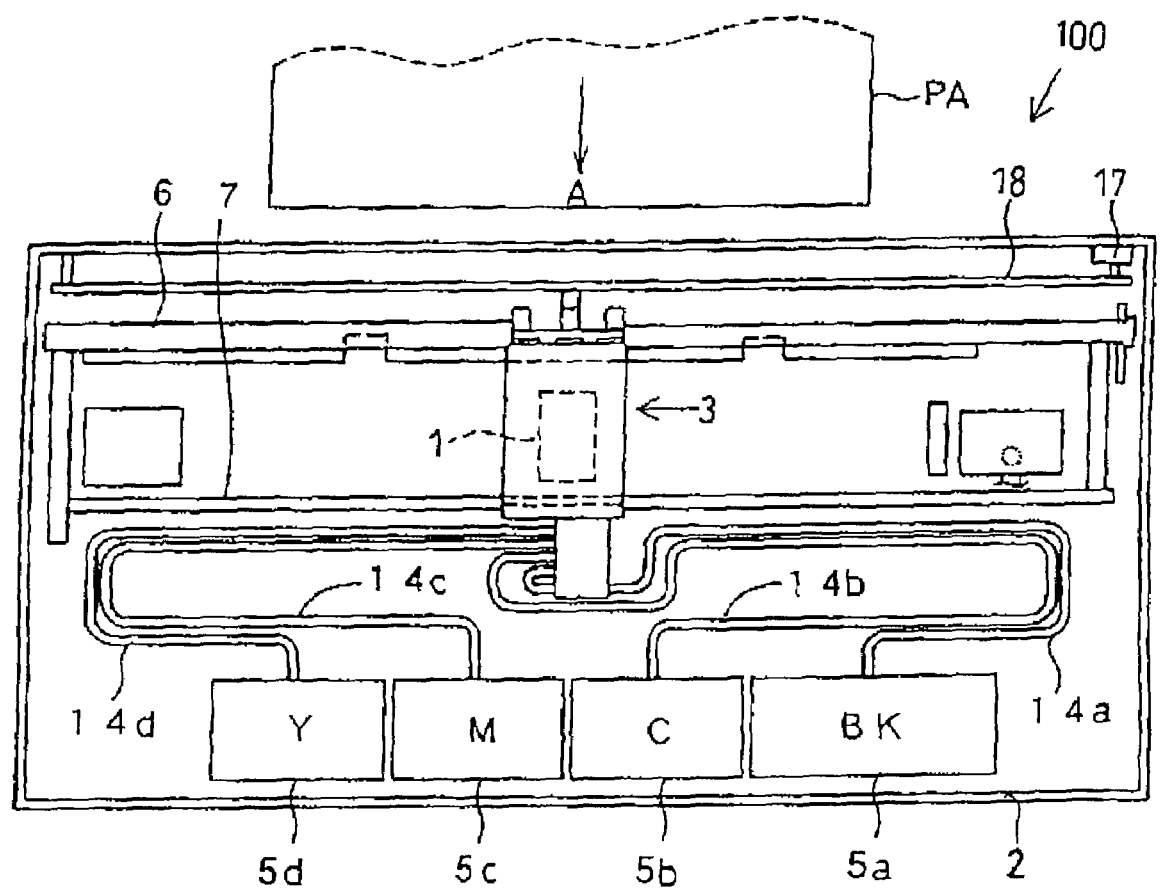
FIG. 1 is a plan view showing an ink-jet recording apparatus according to a first embodiment of the invention.

Referring to the drawings, there will be described preferred embodiments of the present invention. FIG. 1 shows a recording apparatus of the present invention embodied as an ink-jet recording apparatus 100. The ink-jet recording apparatus 100 according to a first embodiment is utilized, for instance, not only as an independent printer device, but also as a printer function of a Multi Function Device (MFD) with a copier function, a scanner function, a facsimile function, etc. Inside a body frame 2 of the ink-jet recording apparatus 100, there is disposed a carriage 3 equipped with a recording head 1 which performs recording by ejection of ink onto a sheet PA as a recording medium.

In the body frame 2, the carriage 3 is slidably held on or supported by a rear guide shaft 6 and a front guide shaft 7 which are disposed in parallel with each other so as to extend in a main scanning direction of the carriage 3, i.e., in a Y direction shown in FIG. 1. The carriage 3 is configured to reciprocate in the main scanning direction, i.e., in the Y direction, by a carriage-driving motor 17 disposed at a right rear portion of the body frame 2 as seen in FIG. 1 and a timing belt 18 as an endless belt. Inks are supplied from respective ink supply sources (i.e., ink tanks) 5a-5d which are statically disposed in the body frame 2 toward the carriage 3 via respective ink supply tubes 14a-14d. In the exemplary embodiment, there are respectively accommodated, in the respective ink tanks 5a-5d, inks of four colors, e.g., a yellow ink (Y), magenta ink (M), a cyan ink (C), and a black ink (Bk).

The sheet PA is horizontally fed by a known sheet-feeding mechanism (not shown) below a lower surface of the recording head 1 in a sub scanning direction (i.e., an X direction or a direction indicated by an arrow A shown in FIG. 1) perpendicular to the main scanning direction or the Y direction. The inks are ejected downward onto the sheet PA from a plurality of nozzles (not shown) which are open in the lower surface of the recording head 1 that is moved in the main scanning direction or the Y direction, whereby the recording is performed. In the following description, a side or a surface of each component of the ink-jet recording apparatus 100 which is nearer to a side or a surface of the recording head 1 in which the nozzles are open (i.e., nozzle-opening surface or side of the recording head 1) is referred to as a front or lower side or a front or lower surface of each component, while a side or a surface of each component which is remote from the nozzle-opening surface or nozzle-opening side of the recording head 1 is referred to as a back or upper side or a back or upper surface of each component.

Figure 2:
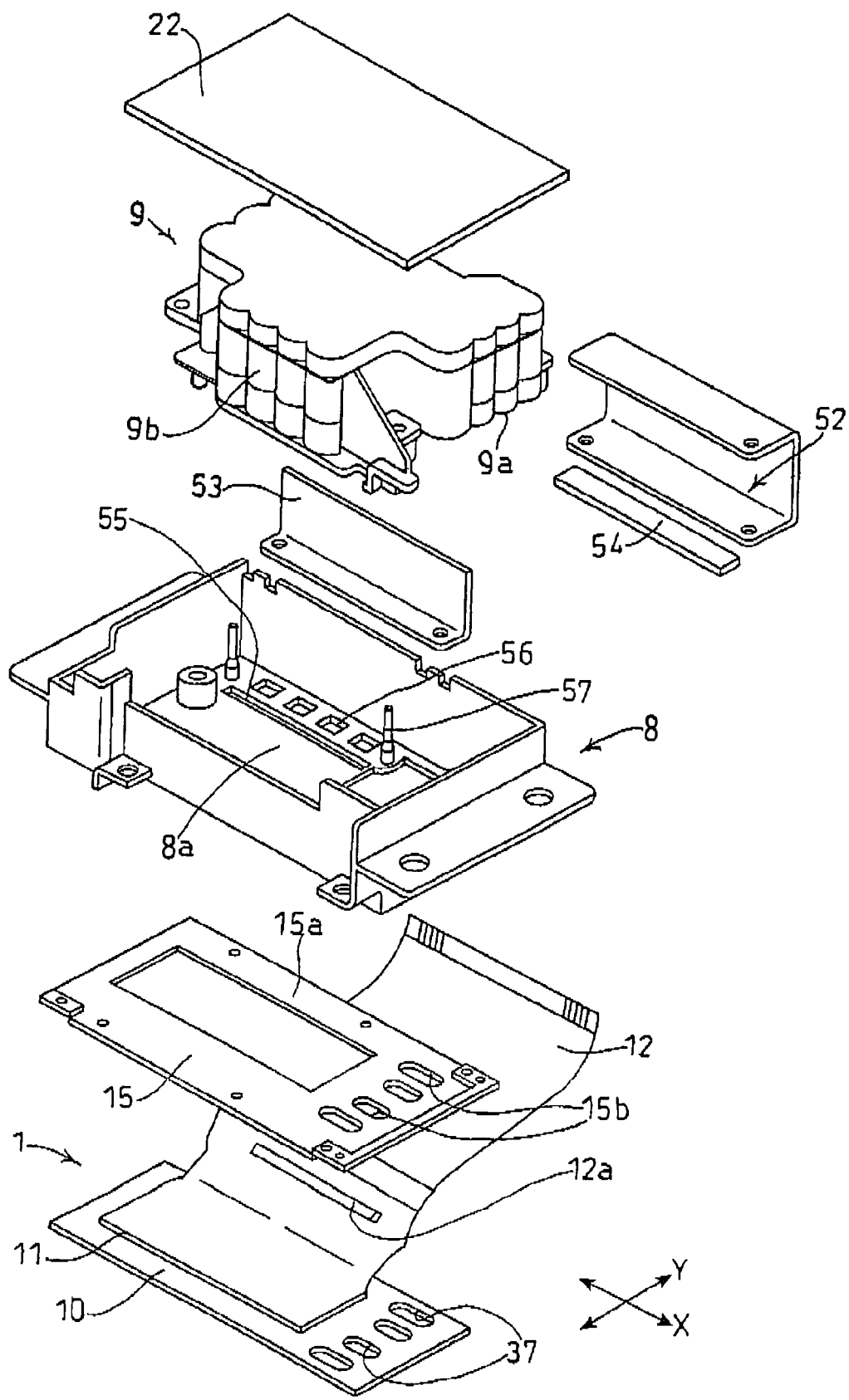
FIG. 2 is an exploded perspective view of a carriage in the first embodiment.
Figure 3:
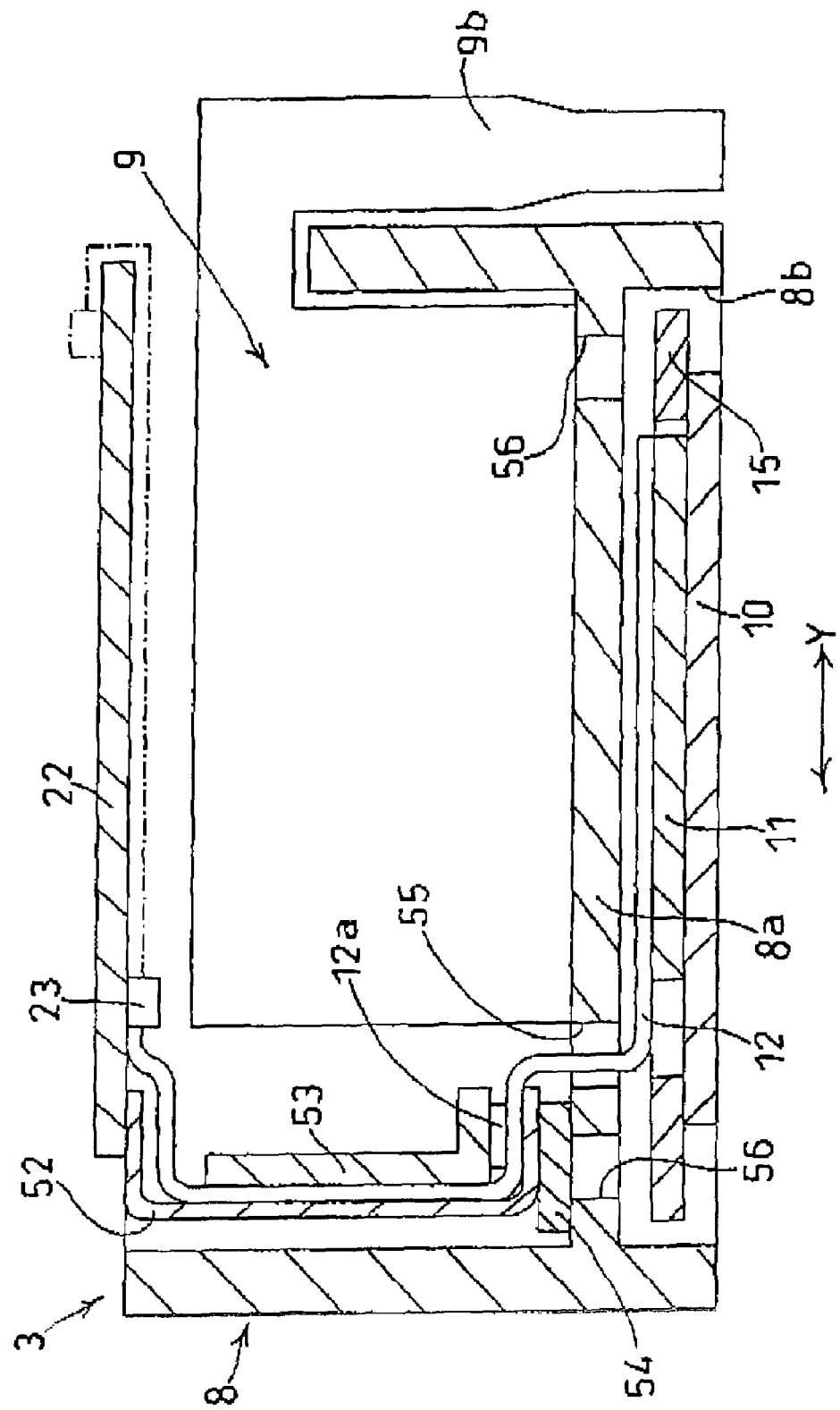
FIG. 3 is a cross-sectional view schematically showing the carriage taken along a line extending in a Y direction.

As shown in FIGS. 2 and 3, the carriage 3 includes a head holder 8 having a generally box-like shape which is open upward. On a lower side of a bottom plate 8a of the head holder 8, a recessed portion 8b is formed so as to be open downward. The recording head 1 is fixedly accommodated in the recessed portion 8b such that the nozzles are exposed downward and such that the recording head 1 is kept in a posture substantially parallel to the bottom plate 8a.

On a back side of the head holder 8, there is disposed a head-side circuit board 22 on which is formed an electric circuit that is electrically connected to a body-side circuit board 90 disposed in the body frame 2, via a flexible wiring member 99. The body-side circuit board 90 and the flexible wiring member 99 are shown in FIG. 8. The head-side circuit board 22 is disposed at a position where the head-side circuit board 22 overlaps the recording head 1 in a plan view when viewed from the back side of the head holder 8. The head-side circuit board 22 receives signals for driving the recording head 1 from the body-side circuit board 90 as an external signal source.

On an upper side of the bottom plate 8a of the head holder 8, there is disposed, between the recording head 1 and the head-side circuit board 22, a damper device 9 which stores the inks that have been supplied toward the carriage 3. An inner space of the damper device 9 is divided into a plurality of ink chambers in which are respectively stored the inks of different colors that have been supplied via the respective ink supply tubes 14a-14d. The damper device 9 has: air-discharging valve means 9b which is for removing air bubbles remaining in the inks stored in the respective ink chambers; and ink outlets 9a through which the inks are supplied to the recording head 1.

An opening (not shown) is formed through the bottom plate 8a of the head holder 8. As shown in FIGS. 2 and 3, inside the opening, the ink outlets 9a of the damper device 9 are connected to respective ink inlets 37 formed in the recording head 1 via respective connecting holes 15b formed in a reinforcing frame 15 (which will be described), whereby the inks of the different colors are supplied independently of each other from the damper device 9 to the recording head 1.

As shown in FIGS. 2 and 3, there is formed, through the bottom plate 8a of the head holder 8, a slit 55 through which a flexible wiring member 12 (that will be described in greater detail) of the recording head 1 is inserted from a front side of the bottom plate 8a to a back side thereof. The flexible wiring member 12 extending from an actuator 11 passes through the slit 55, extends upward along an inner surface of a side wall of the head holder 8, and is connected to a connector 23 provided on the head-side circuit board 22. The bottom plate 8a is further formed with through-holes 56 through which an adhesive agent is poured for fixing the recording head 1 to the front side of the bottom plate 8a.

A radiator 52 and an auxiliary radiator 53 for dissipating heat generated in a drive IC chip 12a are fixed to the head holder 8 by projections 57 provided so as to project upward from the bottom plate 8a. The radiator 52 and the auxiliary radiator 53 will be explained in greater detail.

The recording head 1 has a laminar structure in which a cavity portion 10 and the actuator 11 are stacked on each other. The cavity portion 10 includes the plurality of nozzles which are open in its lower surface and ink channels which are formed therein. The actuator 11 applies an ejection pressure to the ink in the cavity portion 10. Further, the reinforcing frame 15 is fixed on a back surface of the cavity portion 10, and the flexible wiring member 12 superposed on and is bonded to a back surface of the actuator 11. The flexible wiring member 12 outputs drive signals transmitted from the drive IC chip 12a equipped with a drive circuit for selectively driving the actuator 11.

Like known cavity portions disclosed in JP-A-2001-246744 and JP-A-2005-313428, for instance, the cavity portion 10 is configured such that the inks individually supplied to the corresponding ink inlets 37 which are exposed on an upper surface of the cavity portion at its one of opposite end portions in the X direction are distributed, through the corresponding manifold chambers (not shown) in the cavity portion 10, into a plurality of pressure chambers (not shown). Operable portions of the actuator 11 each as an active portion are actuated to selectively apply the ejection pressure to the pressure chambers, whereby the inks are ejected from the nozzles communicating with the corresponding pressure chambers.

Figure 4:
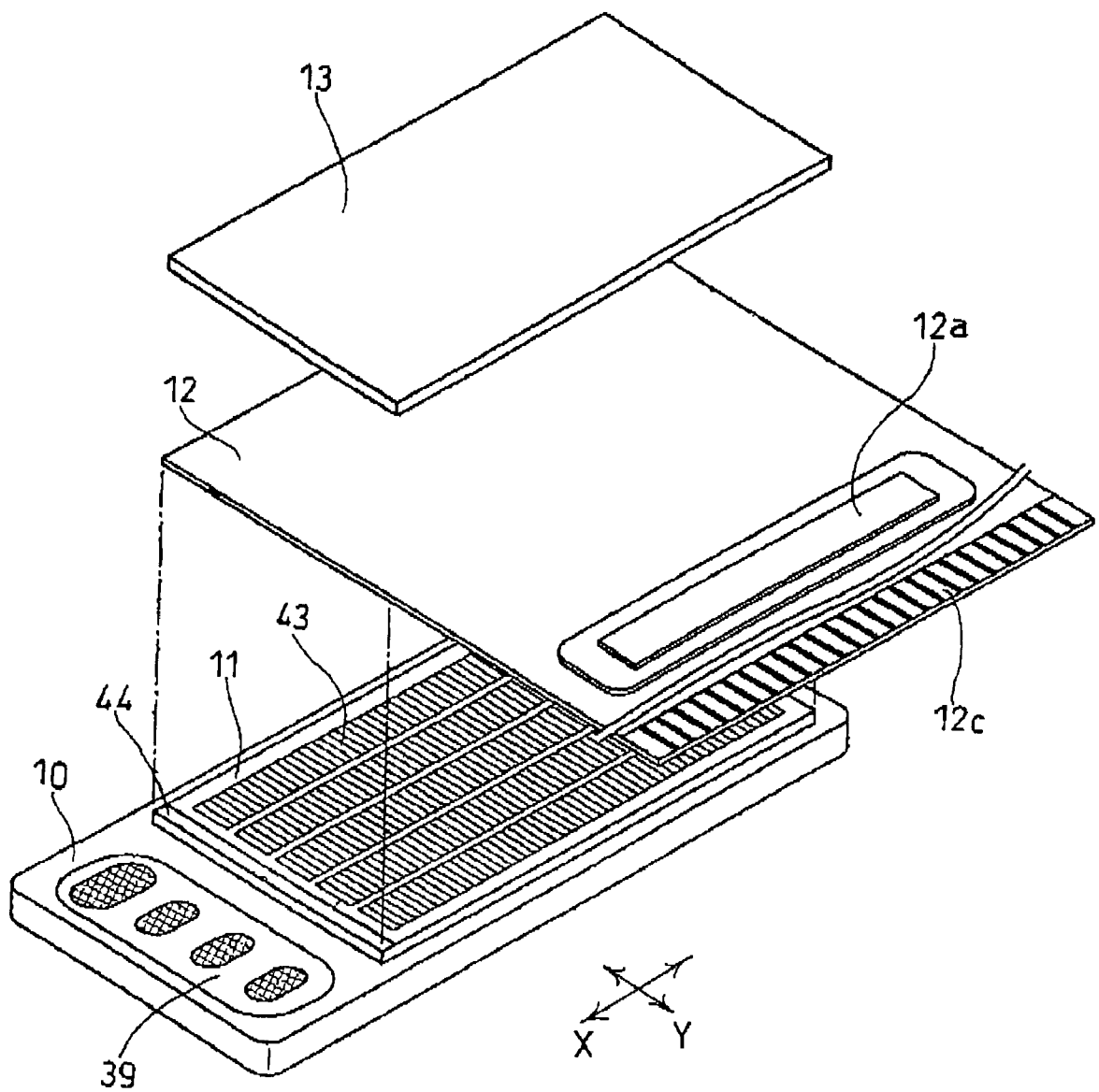
FIG. 4 is an exploded perspective view showing a recording head in the first embodiment.

The actuator 11 in the present embodiment has a construction similar to that of a known actuator disclosed in JP-A-2005-322850, for instance. More specifically explained, the actuator 11 includes a plurality of ceramic layers which are stacked on each other in a direction perpendicular to planes thereof and inner electrodes (not shown) each sandwiched by and between adjacent two of the ceramic layers. In each of the ceramic layers, the operable portions, i.e., the active portions, are formed such that each active portion is located in an area of the ceramic layer vertically interposed between adjacent two of the inner electrodes. Described in detail, the inner electrodes include inner individual electrodes corresponding to the respective pressure chambers and inner common electrodes each common to the plurality of pressure chambers. Accordingly, one active portion is formed in an area of each ceramic layer vertically interposed between one inner individual electrode and a corresponding portion of one inner common electrode. As shown in FIG. 4, there are formed, on an upper surface of the actuator 11, external individual terminals 43 connected to the respective inner individual electrodes via respective electric through holes and an external common terminal 44 connected to the inner common electrodes. The active portions are deformed by drive pulse signals applied to the corresponding external individual terminals 43, whereby the ejection pressure is selectively given to the corresponding pressure chambers. The external individual terminals 43 and the external common terminal 44 are electrically connected to terminals 12b (shown in FIG. 5) formed on the flexible wiring member 12.

The reinforcing frame 15 is for reinforcing the cavity portion 10 and is a frame-like member made of a material having a higher degree of rigidity than the cavity portion 10. For instance, the reinforcing frame 15 is provided by a metal plate formed of SUS. The reinforcing frame 15 has a size in its plan view somewhat larger than that of the cavity portion 10. The reinforcing frame 15 is superposed on and fixedly bonded to the back surface of the cavity portion 10 so as to surround the actuator 11, thus preventing deformation and distortion of the cavity portion 10 having a thin flat shape. The above-described connecting holes 15b formed in the reinforcing frame 15 which correspond to the respective ink inlets 37 of the cavity portion 10 are formed through the thickness of a frame portion 15a of the reinforcing frame 15 at its one of opposite end portions as seen in the X direction.

The flexible wiring member 12 is a flexible band-like cable for electrically connecting the above-described head-side circuit board 22 and the actuator 11 to each other. The flexible wiring member 12 is elongated in a direction in which a multiplicity of conductor wires formed thereon extend. The drive IC chip 12a as a drive circuit for driving the actuator 11 is mounted on the flexible wiring member 12 at a position in a longitudinal direction of the same 12 which is nearer to the head-side circuit board 22 than a position at which the flexible wiring member 12 is connected to the actuator 11. The drive signals from the body-side circuit board 90 are transmitted through the conductor wires of the flexible wiring member 12 to the actuator 11 via the drive IC chip 12a. As the flexible wiring member 12, there is employed a single chip-on film (COF) flexible flat cable which ensures a high degree of freedom in wring layout. In the following description, one of the opposite surfaces of the flexible wiring member 12 on which the drive IC chip 12a is mounted is referred to as a first surface while the other of the opposite surfaces which is connected to the actuator 11 is referred to as a second surface.

As shown in FIG. 4, one of longitudinally opposite end portions of the flexible wiring member 12 is electrically connected at its second surface to the actuator 11. On the other of the longitudinally opposite end portions of the flexible wiring member 12, there are formed terminals 12c which are to be connected to the connector 23 provided on the head-side circuit board 22 so as to be attachable thereto and detachable therefrom. While the connector 23 is disposed on a front or lower surface of the head-side circuit board 22 in the present embodiment, the connector 23 may be disposed on a back or upper surface of the head-side circuit board 22 and the flexible wiring member 12 may be routed on the back surface of the same 22, as indicated in a one-dot chain line of FIG. 3.

Figure 5:
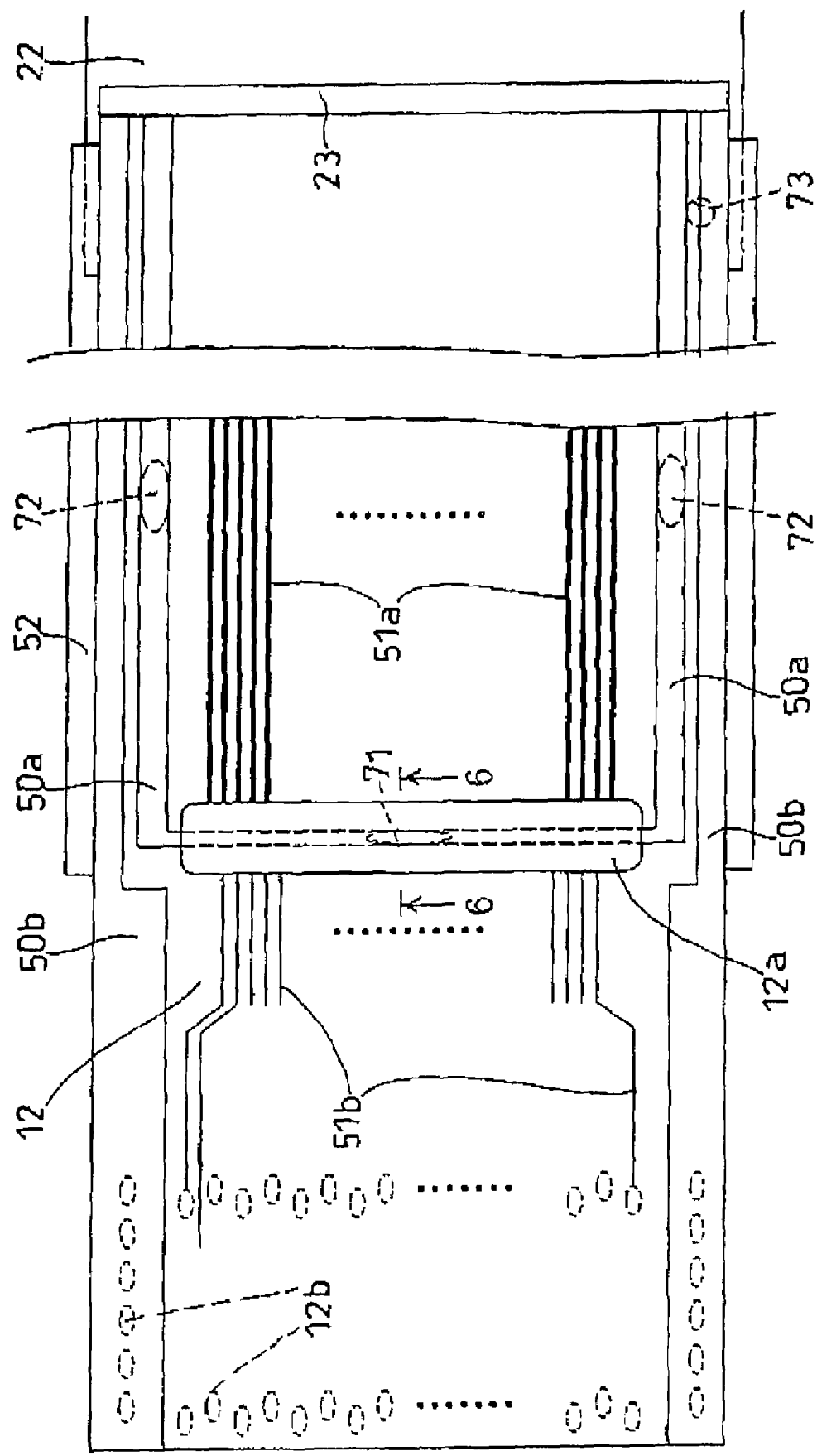
FIG. 5 is a developed view for explaining overlapping of a flexible wiring member and a radiator in the first embodiment.
Figure 6:
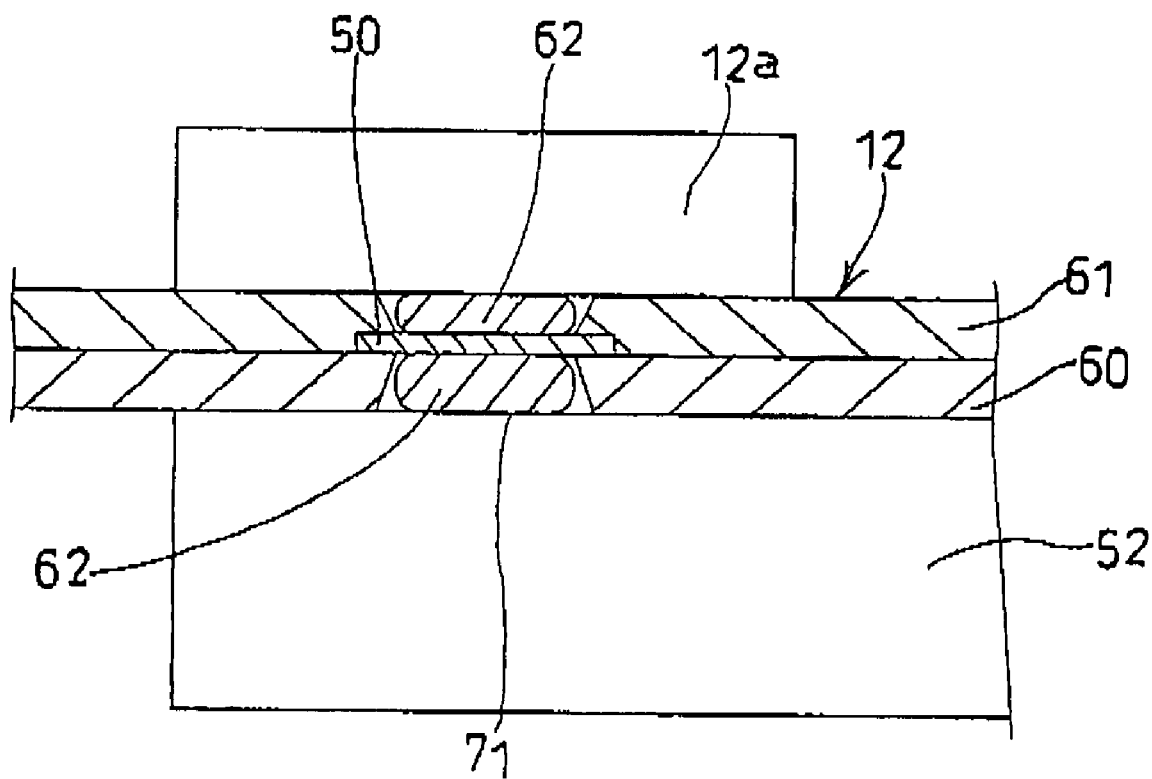
FIG. 6 is a cross-sectional view taken along line 6-6 in FIG. 5 for explaining joining of a common voltage wire and the radiator in a mount region of a drive IC chip in the first embodiment.

As shown in FIG. 6, the flexible wiring member 12 is constituted by including: a band-like base film 60 formed of a synthetic resin material such as a polyimide resin having electrical insulating property and flexibility; the terminals 12b and conductor wires 50, 51 formed using an electrical conductive material such as copper on one surface of the base film 60 by photolithography or the like; and a cover film 61 formed of a synthetic resin material such as a polyimide resin having electrical insulating property and flexibility so as to cover the base film 60, the conductor wires 50, 51, and the terminals 12b. On the second surface of the flexible wiring member 12, portions of the base film 60 are removed to form the terminals 12b (FIG. 5) to be connected to the external individual terminals 43 and the external common terminal 44 of the actuator 11 such that the terminals 12b are exposed on the second surface of the flexible wiring member 12. On the first surface of the flexible wiring member 12, the drive IC chip 12a is connected to the conductor wires 50, 51 which are exposed on the first surface by removing portions of the cover film 61. The terminals 12b and the terminals 12c are connected to each other via the conductor wires 50, 51 and the drive IC chip 12a.

The conductor wires (50, 51) formed on the flexible wiring member 12 include drive signal wires 51 and common voltage wires 50. The drive signal wires 51 constitute a drive wiring pattern 51a for connection to an input side of the drive IC chip 12a and a drive wiring pattern 51b for connection to an output side of the same 12a. The common voltage wires 50 include: two common voltage wires 50a, 50a which are connected to a common-voltage portion of the drive IC chip 12a and each of which is disposed on a corresponding one of widthwise opposite end portions of the flexible wiring member 12; and two common voltage wires 50b, 50b which are connected to a common-voltage portion of the actuator 11 and each of which is disposed on a corresponding one of the widthwise opposite end portions of the flexible wiring member 12. The drive signal wires 51 are disposed so as to be interposed between the common voltage wires 50a, 50b formed on one of the widthwise opposite end portions of the flexible member 12 and the common voltage wires 50a, 50b formed on the other of the widthwise opposite end portions of the same 12.

Each of the drive conductor wires 51 of the output-side drive wiring pattern 51b is connected to a corresponding one of the terminals 12b which are respectively connected to the external individual terminals 43 of the actuator 11 while one of opposite ends of each of the common voltage wires 50b, which end is nearer to the actuator 11, is connected to the corresponding terminals 12b which are connected to the external common electrode 44 of the actuator 11. Each of the drive conductor wires 51 of the input-side drive wiring pattern 51a, each of the common voltage wires 50a, and the other of the opposite ends of each of the common voltage wires 50b nearer to the head-side circuit board 22 are connected to the corresponding terminals 12c formed on the other of the longitudinally opposite end portions of the flexible wiring member 12. As each of the common voltage wires 50a, 50b, there is employed a conductor wire whose line width is larger than that of each of the drive signal wires 51 of the drive wiring patterns 51a, 51b, in an attempt to reduce an impedance. The common voltage wires 50a, 50b are connected to the ground, for instance, as a common voltage of the body-side circuit board 90 via the corresponding terminals 12c and the head-side circuit board 22.

The common voltage wires 50a, 50a disposed on one and the other of the widthwise opposite end portions of the flexible wiring member 12 are coupled to each other right below the drive IC chip 12a, namely, in a mount region of the drive IC chip 12a, whereby the two common voltage wires 50a are integrated into a unitary common voltage wire 60a, as shown in FIG. 5. The unitary common voltage wire 50a has a first joint portion 71 at which the unitary common voltage 50a is partially exposed on the second surface of the flexible member 12 in a region that corresponds to the mount region of the driver IC chip 12a, for permitting the unitary common voltage wire 50a to be joined to the radiator 52 as explained below.

At a longitudinally intermediate portion of the flexible wiring member 12 which is located between the drive IC chip 12a and the head-side drive circuit 22, each of the common voltage wires 50a has a second joint portion 72 at which each common voltage wire 50a is partially exposed on the second surface of the flexible wiring member 12 for permitting each common voltage wire 50a to be joined to the radiator 52. Because the common voltage wires 50a are provided on one and the other of the widthwise opposite end portions of the flexible wiring member 12, there are formed, at the longitudinally intermediate portion of the flexible wiring member 12, two second joint portions 72 in total on one and the other of the two common voltage wires 50a.

Further, there is formed a third joint portion 73 on a common-voltage portion of the head-side circuit board 22, namely, on a common voltage wire (not shown) disposed on the head-side circuit board 22, for permitting the common voltage wire to be joined to the radiator 52.

The radiator 52 is formed of a flexible sheet material such as aluminum having good heat conductivity and good electrical conductivity and is for dissipating heat generated in the drive IC chip 12a and providing a conductive path parallel to the common voltage wires 50a. The radiator 52 is disposed along the second surface of the flexible wiring member 12, so as to extend from the mount region of the drive IC ship 12a toward the other of the longitudinally opposite end portions of the flexible wiring member 12 where the terminals 12c are formed, up to a position at which the radiator 52 overlaps the head-side circuit board 22. The radiator 52 is joined, via a heat-conductive and electrically connectable material such as a solder 62, to the common voltage wires 50a at the first joint portion 71 and the second joint portions 72, 72 and to the common voltage wire provided on the head-side circuit board 22 at the third joint portion 73

In the present embodiment, as shown in FIG. 3, the flexible wiring member 12 passes through the slit 55 formed in the bottom plate 8a of the head holder 8, rises on the back surface of the bottom plate 8a, and is routed to the head-side circuit board 22 disposed in parallel with the bottom plate 8a. The radiator 52 is disposed so as to be bent along the flexible wiring member 12.

The first joint portion 71 is preferably formed in the vicinity of a portion of the common voltage wire 50a at which the common voltage wire 50a is connected to the common-voltage portion of the drive IC chip 12a, for increasing heat dissipating efficiency. Here, the first joint portion 71 is located within the mount region of the drive IC chip 12a. Depending upon the wiring layout, the first joint portion 71 may be located outside the mount region. The radiator 52 may be formed of not only the flexible sheet material but also a rigid plate material. In this instance, the radiator 52 may be joined otherwise than the soldering described above. For instance, there may be formed mounting holes in the head-side circuit board 22, and the radiator 52 may be screwed to the head-side circuit board 22 through the mounting holes. It is noted that there can be ensured a heat dissipation effect even where the radiator 62 is simply pressed by the auxiliary radiator 53 or the like so as to be held in contact with the common voltage wires at the first, the second, and the third joint portions 71, 72, 73.

In the exemplary first embodiment, the auxiliary radiator 53 is disposed on the first surface of the flexible wiring member 12 so as to be in close contact with an upper surface of the drive IC chip 12a, i.e., one of opposite surfaces of the drive IC chip 12a which is remote from the flexible wiring member 12a. A rubber elastic member 54 is disposed between a bottom of the radiator 52 and the bottom plate 8a of the head holder 8. Owing to the biasing force of the rubber elastic member 54, the radiator 53 is brought into close contact with the drive IC chip 12a, whereby the drive IC chip 12a is held by and sandwiched between the radiator 52 and the auxiliary radiator 53. The provision of the auxiliary radiator 53 further enhances the effect of dissipating the heat generated in the drive IC chip 12a. Where the radiator 52 has a heat capacity which is sufficient for the dissipation of the heat generated in the drive IC chip 12a, the auxiliary radiator 53 may be eliminated.

In the ink-jet recording apparatus 100 constructed as described above, the heat generated in the drive IC chip 12a is transmitted to the radiator 52 through the first joint portion 71. Accordingly, the heat can be transmitted to the radiator 52 at a position considerably close to the drive IC chip 12a, thereby ensuring efficient heat dissipation. Further, the radiator 52 extends from the mount region of the drive IC chip 12a toward the head-side circuit board 22, so that the heat transmitted to the radiator 52 is conducted in a direction away from the actuator 11. Accordingly, the heat transmitted from the drive IC chip 12a to the radiator 52 is prevented from being conducted to the recording head 1, more specifically, to the actuator 11, thereby obviating a malfunction of the recording head 1 due to the heat otherwise conducted thereto and ensuring a stabilized recording quality.

The radiator 52 is electrically joined not only to the common voltage wire 50a at the first joint portion 71 thereof, but also to the common voltage wires 50a at the respective second joint portions 72, 72 located at the longitudinally intermediate portion of the flexible wiring member 12 which is between the drive IC chip 12a and the head-side circuit board 22. In addition, the radiator 52 is electrically joined, at the third joint portion 73, to the common voltage wire formed on the head-side circuit board 22. According to the arrangement, the radiator 52 functions substantially as a common voltage wire. That is, the arrangement in the first embodiment realizes a state in which the line width of the common voltage wires 50 is substantially increased between the head-side circuit board 22 and the drive IC chip 12, so that the heat capacity of the common voltage wires 50 is increased to lower the impedance thereof.

In other words, by heat-conductively and electrically joining the radiator 52 to the common voltage wires 50, the heat generated in the drive IC chip 12a can be dissipated, and the impedance of the ground wires (i.e., the common voltage wires 50) upon driving the actuator 11 can be substantially lowered. In consequence, even when a large number of the nozzles of the recording head 1 are simultaneously driven and a large current passes through the common voltage wires, the ink can be ejected with high stability.

In the recording apparatus 100 according to the illustrated first embodiment, the radiator 52 is disposed on the second surface of the flexible wiring member 12 opposite to the first surface thereof on which the drive IC chip 12a is mounted. Accordingly, the radiator 52 can be joined to the common voltage wires 50a exposed on the second surface of the flexible wiring member 12 without a fear of interfering the drive IC chip 12a.

The radiator 52 is joined to the common voltage wire 50a in the mount region of the drive IC chip 12a, whereby the radiator 52 can be joined at a position considerably close to the drive IC chip 12a as a heat generating source, resulting in an enhanced heat dissipating efficiency.

The common voltage wires 50a disposed on one and the other of the widthwise opposite end portions of the flexible wiring member 12 are joined to the radiator 52 at the respective second joint portions 72, 72 in the longitudinally intermediate portion of the flexible wiring member 12. According to the arrangement, the radiator 52 and the common voltage wires 50a can be joined to each other with high reliability, thereby allowing the radiator 52 to sufficiently function as the common voltage wire.

The radiator 52 extends up to the position at which the radiator 52 overlaps the head-side circuit board 22, so that the heat capacity of the radiator 52 is increased to enhance the heat dissipating effect.

Because the radiator 52 is heat-conductively and electrically joined to the common-voltage portion of the head-side circuit board 22, the radiator 52 can be joined to a common voltage wire for the drive IC chip 12a with high reliability, permitting the radiator 52 to sufficiently function as the common voltage wire.

The common voltage wires are connected to the ground, thereby reducing the impedance of the ground wires (the common voltage wires 50a) connected to the drive IC chip 12a.

Figure 7:
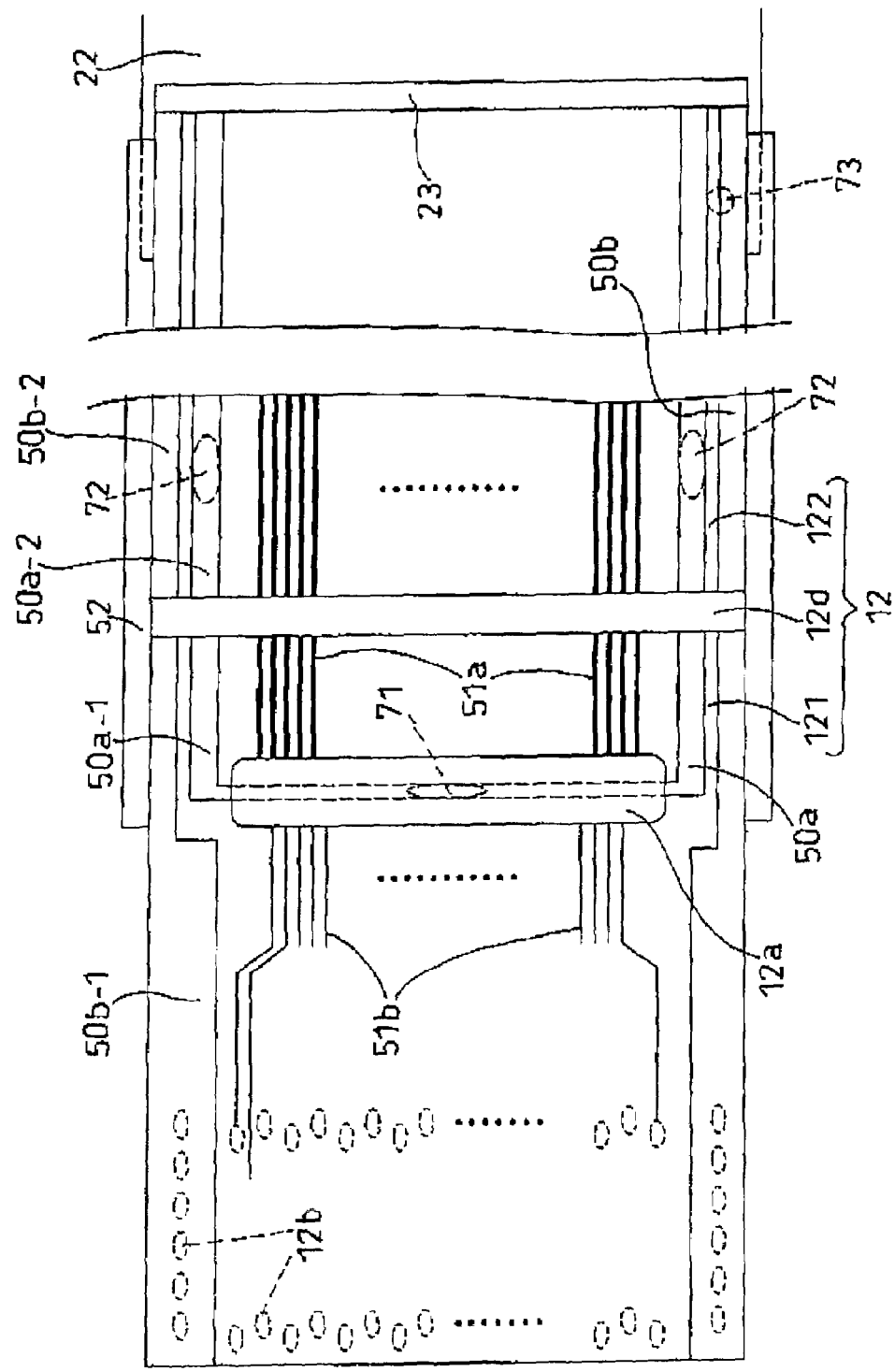
FIG. 7 is a developed view for explaining overlapping of a flexible wiring member and a radiator in a second embodiment.

Referring next to FIG. 7, there will be explained a second embodiment of the invention. In the second embodiment, the same reference numerals as used in the illustrated first embodiment are used to identify the corresponding components, and its detailed explanation is dispensed with. In the second embodiment, the flexible wiring member 12 is constructed such that two wiring members are connected to each other in the longitudinal direction of the flexible wiring member 12.

As shown in FIG. 7, in the flexible wiring member 12 of the second embodiment, a first wiring member 121 which is connected to the actuator 11 and on which the drive IC chip 12a is mounted is connected, via a connecting portion 12d, to a second wiring member 122 which is connected to the head-side circuit board 22. As the first member 121, the chip on film (COF) is employed. As the second wiring member 122, there is employed a flexible printed circuit board (FPC) or an ordinary flexible flat cable (FFC) on which conductor wires are arranged in parallel to each other. The flexible wiring member 12 may be composed three or more wiring members connected to each other. The flexible wiring member 12 may be constructed such that the COF and the FFC are connected via the FPC.

On the thus constructed flexible wiring member 12 of the second embodiment, there are formed common voltage wires (50a, 50b) which include; first common voltage wires 50a-1, 50b-1 formed on the first wiring member 121; and second common voltage wires 50a-2, 50b-2 formed on the second wiring member 122. The first common voltage wires 50a-1, 50b-1 formed on the first wiring member 121 are connected to the corresponding second common voltage wires 50a-2, 50b-2 formed on the second wiring member 122 via corresponding terminals (not shown) provided in the connecting portion 12d, in a one-to-one correspondence. Similarly, the drive signal wires 51 of the input-side drive wiring pattern 51a are formed over the first and second wiring members 121, 122 so as to be connected to each other via corresponding terminals (not shown) provided in the connecting portion 12d, in a one-to-one correspondence.

As in the illustrated first embodiment, the first common voltage wires 50a-1 formed on the first wiring member 121 are integrated into a unitary common voltage wire 50a-1 in the mount region on which the drive IC chip 12a is mounted. The unitary common voltage wire 50a-1 has a first joint portion 71 which is located within the mount region and at which the radiator 52 is joined to the unitary common voltage wire 50a-1. Each of the second common voltage wires 50a-2 formed on the second wiring member 122 has a second joint portion 72 at which the radiator 52 is joined to each of the second common voltage wires 50a-2. Further, there is formed a third joint portion 73 on a common-voltage portion of the head-side circuit board 22, namely, on a common voltage wire (not shown) disposed on the head-side circuit board 22, for permitting the common voltage wire to be joined to the radiator 52.

The second embodiment described above ensures a reduction in the cost of the flexible wiring member 12 while offering advantages similar to those described above with respect to the illustrated first embodiment.

Referring next to FIG. 8, there will be explained an electric circuit employed in the illustrated first and second embodiments. FIG. 8 shows the electric circuit in a case where the flexible wiring member 12 is constituted by a singe wiring member as in the first embodiment. The electric circuit can be employed in a case where the flexible wiring member 12 is constituted by two wiring members, e.g., the first and second wiring members 121, 122 as in the second embodiment. In the circuit diagram of FIG. 8, a VSS2 line corresponds to the common voltage wires 50a in the first embodiment while a COM line corresponds to the common voltage wires 50b connected to the common-voltage portion of the actuator 11.

In the present ink-jet recording apparatus 100, the body-side circuit board 90, the head-side circuit board 22, the drive IC chip 12a, and the actuator 11 are connected via the flexible wiring members 99, 12. The body-side circuit board 90 includes a control circuit 93, a control-signal power source 94, and a drive-pulse power source 95. The drive IC chip 12a includes a signal-converting circuit 96 and a drive-voltage-signal generating circuit 97.

The control circuit 93 is for outputting, to the signal-converting circuit 96, control signals such as enable, data, clock, strobe signals, based on suitable recording information. The control circuit 93 is connected to the signal-converting circuit 96 via control-signal lines 98. The control-signal power source 94 is for applying a voltage, e.g., a voltage of 5 V, to the signal-converting circuit 96 and is connected to the signal-converting circuit 96 via a drive VDD1 line for applying a drive voltage and a ground VSS1 line. The drive-pulse power source 95 is for applying a voltage, e.g., a voltage of 20 V, to the drive-voltage-signal generating circuit 97 and is connected to the same 97 via a drive VDD2 line and the ground VSS2 line.

More specifically explained, the body-side circuit board 90 and the head-side circuit board 22 are connected via the flexible wiring member 99 including the drive VDD1, VDD2 lines, the ground VSS1, VSS2 lines, and the control-signal lines 98, which lines are arranged on a plane of the flexible wiring member 99. The actuator 11 and the head-side circuit board 22 are connected via the flexible wiring member 12 which includes, on a plane thereof, the above-described lines and the common voltage line COM connected to the external common terminal 44 of the actuator 11 and on which the drive IC chip 12a is mounted. The conductor wires 51 of the drive wiring pattern 51a in the illustrated first and second embodiments include the control-signal lines 98, the drive VDD1 line for applying the drive voltage for the control signals, the ground VSS1 line, and the drive VDD2 line for the drive-pulse power source. The drive signals include the control signals and application of the voltage. The common voltage wires 50a correspond to a portion of the ground VSS2 line for the drive-pulse power source, which portion is on the flexible wiring member 12. The common voltage wires 50b correspond to a portion of the common voltage line COM, which portion is on the flexible wiring member 12.

On the head-side circuit board 22, an electrolysis capacitor 109 is bypass-connected between the drive VDD2 line and the ground VSS2 line. The electrolytic capacitor 109 prevents an occurrence of a drop in the voltage of the drive-pulse power source 95 in a case where a large current momentarily flows through the drive-voltage-signal generating circuit 97. Further, on the head-side circuit board 22, the ground VSS2 line is connected to the common voltage line COM which is connected to the external common terminal 44 of the actuator 11. On the flexible wiring member 12 or in the drive IC chip 12a, the ground VSS2 line and the ground VSS1 line are connected to each other via a resistance R, whereby the drive-voltage-signal generating circuit 97 and the signal-converting circuit 96 are kept at the same voltage.

The signal-converting circuit 96 is for converting the control signals from the control circuit 93 into control signals that correspond to the respective nozzles and includes shift registers 106, D flip-flops 107, and gate circuits 108. The number of each of the shift registers 106, D flip-flops 107, and gate circuits 108 is equal to the number of the nozzles. Among the control signals transmitted from the control circuit 93 via the control-signal lines 98, the data signals and the clock signals are sent to the shift registers 106, the strobe signals are sent to the D flip-flops 107, and the enable signals are sent to the gate circuits 108. The data signals are serially transmitted from the control circuit 93, converted by the shift registers 106 into parallel signals corresponding to rows of the nozzles, and outputted from the D flip-flops 107 based on the strobe signals. Then the enable signals (i.e., the drive pulse signals) corresponding to the data signals are outputted from the gate circuits 108.

The drive-voltage-signal generating circuit 97 generates and outputs a drive pulse by converting, based on the voltage applied from the drive-pulse power source 95, each enable signal (i.e., the drive pulse signal) outputted from the corresponding gate circuit 108 into a voltage for driving the actuator 11. There are provided 150 driver circuits 110 corresponding to the number of the nozzles.

In the thus constructed recording apparatus, the voltage to be applied from the control-signal power source 94 is applied to the signal-converting circuit 96 via the drive VDD1 line, thereby normally driving the signal-converting circuit 96. The voltage to be applied from the drive-pulse power source 95 is applied to the drive-voltage-signal generating circuit 97 via the drive VDD2 line and at the same time permits the electrolytic capacitor 109 disposed therebetween to be charged. When the ink is ejected, there is supplied a current from the electrolytic capacitor 109 to the drive-voltage-signal generating circuit 97 via the drive VDD2 line, so that a sufficient amount of the current is supplied to the actuator 11.

In the circuit structure described above, the VDD1, VDD2 lines, the VSS1, VSS2 lines, and the common voltage line COM in FIG. 8 are symmetrically arranged on the flexible wiring member 12 along its widthwise opposite end portions that are parallel to the direction of extension of the same 12 from the actuator 11.

In the illustrated embodiments, each common voltage wire 50a and each common voltage wire 50b are formed independently of each other on the flexible wiring member 12 for performing, in a production process of the apparatus, a polarization treatment of a piezoelectric material of the actuator 11 under a high voltage as known in the art, in a state in which the actuator 11 to which the flexible wiring member 12 has been connected is not yet connected to the head-side circuit board 22. Where the flexible wiring member 12 is connected to the actuator 11 which has been subjected to the polarization treatment, a single conductor wire can be utilized as the common voltage wires 50a, 50b on the flexible wiring member 12. Further, where the actuator 11 is of an electrostatic type or of a thermal type, in place of the piezoelectric type, a single conductor w/e can be utilized as the common voltage wires 50a, 50b.

While the ink-jet recording apparatus to which the principle of the present invention is applied has been described in the embodiments described above, the principle of the invention is equally applicable to various types of recording apparatus such as an impact type, provided that the recording apparatus is equipped with a plurality of recording elements and operable portions (active portions) respectively corresponding to the recording elements.

It is to be understood that the invention is not limited to the details of the illustrated embodiments, but may be embodied with various changes and modifications, which may occur to those skilled in the art, without departing from the spirit and scope of the invention defined in the attached claims.

What is claimed is:

1. A recording apparatus, comprising:
a recording head including an actuator and operable to perform recording by an operation of the actuator;
a head holder holding the recording head;
a circuit board disposed on the head holder and configured to be connected to an external signal source;
a drive circuit operable to drive the actuator;

a flexible wiring member which includes a plurality of conductor wires that connect the actuator and the circuit board, which is elongated in a direction in which the plurality of conductor wires extend, which is connected to the actuator and the circuit board at longitudinally opposite ends thereof, respectively, and on which the drive circuit is mounted between the longitudinal opposite ends, the plurality of conductor wires including a common voltage wire which connects a common-voltage portion of the drive circuit and a common-voltage portion of the circuit board and a drive signal wire for driving the actuator; and a radiator having heat conductivity and electric conductivity and disposed between the recording head and the circuit board so as to extend along the flexible wiring member, the radiator being heat-conductively and electrically joined to: (a) the common voltage wire in the vicinity of the drive circuit; (b) at least one portion of the common voltage wire intermediate between the drive circuit and the circuit board; and (c) at least one of (c-1) the common voltage wire in the vicinity of the circuit board and (c-2) the common-voltage portion of the circuit board which is connected to the common voltage wire of the flexible wiring member.

2. The recording apparatus according to claim 1,
wherein the drive circuit is disposed on the flexible wiring member at a position nearer to the circuit board than a position at which the flexible wiring member is connected to the actuator, and
wherein the radiator is heat-conductively and electrically joined to the common voltage wire in the vicinity of a position at which the drive circuit is connected to the common voltage wire, such that the radiator extends from a position at which the radiator is joined to the common voltage wire toward the circuit board.

3. The recording apparatus according to claim 2,
wherein the radiator extends up to a position at which the radiator overlaps the circuit board, and
wherein the radiator is heat-conductively and electrically joined to the common-voltage portion of the circuit board.

4. The recording apparatus according to claim 1,
wherein the drive circuit is mounted on one of opposite surfaces of the flexible wiring member, and
wherein the radiator is disposed on the other of the opposite surfaces of the flexible wiring member.

5. The recording apparatus according to claim 4, wherein the radiator is joined to the common voltage wire within a region of the other of the opposite surfaces of the flexible wiring member, which region corresponds to a mount region on which the drive circuit is mounted.

6. The recording apparatus according to claim 1,
wherein the plurality of conductor wires of the flexible wiring member include two common voltage wires each as the common voltage wire, the two common voltage wires being disposed on respective widthwise opposite end portions of the flexible wiring member so as to sandwich the drive signal wire therebetween, and
wherein the radiator is joined at a longitudinally intermediate portion of the flexible wiring member to the two common voltage wires disposed on the respective widthwise opposite end portions of the flexible wiring member.

7. The recording apparatus according to claim 1, wherein the common voltage wire is connected to the ground.

8. The recording apparatus according to claim 1,
wherein the flexible wiring member includes: a first wiring member on which the drive circuit is mounted, which is connected to the actuator, and which includes a first common voltage wire that constitutes a part of the common voltage wire and that is connected to the common-voltage portion of the drive circuit; and a second wiring member which connects the first wiring member and the circuit board and which includes a second common voltage wire that constitutes a part of the common voltage wire, and
wherein the radiator is heat-conductively and electrically joined to: (a) the first common voltage wire in the vicinity of the drive circuit; (b) the second common voltage wire; and (c) the common-voltage portion of the circuit board.

* * * * *